(12) United States Patent
Sato et al.

(10) Patent No.: US 11,215,651 B2
(45) Date of Patent: Jan. 4, 2022

(54) POWER CONSUMPTION ESTIMATION DEVICE

(71) Applicant: MITSUBISHI ELECTRIC CORPORATION, Tokyo (JP)

(72) Inventors: Fuyuki Sato, Tokyo (JP); Shinichiro Otani, Tokyo (JP); Genta Yoshimura, Tokyo (JP); Hiroki Kawano, Tokyo (JP); Toshihiro Mega, Tokyo (JP); Yoshinori Nakajima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/083,572

(22) Filed: Oct. 29, 2020

(65) Prior Publication Data
US 2021/0041487 A1  Feb. 11, 2021

Related U.S. Application Data

(60) Provisional application No. PCT/JP2019/009600, filed on Mar. 11, 2019.

(30) Foreign Application Priority Data

Jun. 27, 2018 (JP) .............................. JP2018-122208

(51) Int. Cl.
  *G01R 21/133* (2006.01)
  *G06Q 50/06* (2012.01)
(52) U.S. Cl.
  CPC ........... *G01R 21/133* (2013.01); *G06Q 50/06* (2013.01)
(58) Field of Classification Search
  CPC .................. G01R 21/133; G06Q 50/06
  See application file for complete search history.

(56) References Cited

U.S. PATENT DOCUMENTS

| 7,684,965 B2 * | 3/2010 | Sekine | G05B 15/02 |
| | | | 703/2 |
| 2001/0025209 A1 * | 9/2001 | Fukui | G06Q 50/06 |
| | | | 700/291 |

(Continued)

FOREIGN PATENT DOCUMENTS

| EP | 1 729 223 A2 | 12/2006 |
| JP | 2003-319556 A | 11/2003 |

(Continued)

OTHER PUBLICATIONS

International Search Report, issued in PCT/JP2019/009600, dated Jun. 11, 2019.

(Continued)

*Primary Examiner* — Raymond L Nimox
(74) *Attorney, Agent, or Firm* — Birch, Stewart, Kolasch & Birch, LLP

(57) ABSTRACT

A power consumption estimation device (10) which estimates power consumption of each of one object facility (100) or more whose operation statuses can be monitored includes: a total power vector generation unit (32) to acquire time-series data of total power consumption; a status matrix generation unit (34) to acquire time-series data of an operation parameter of the one object facility (100) or more; a reference signal generation unit (36) to generate one reference signal or more; a contribution degree estimation unit (38) to perform multiple regression analysis by taking the total power consumption as an objective variable, and the operation parameter of the one object facility (100) or more and a component value of the one reference signal or more, as explanatory variables, to thereby calculate a contribution degree of each of the one object facility (100) or more; and a breakdown calculation unit (42) to multiply the contribution degree of the object facility (100) and the operation (Continued)

parameter of the object facility (100), to thereby calculate power consumption of the object facility (100).

16 Claims, 11 Drawing Sheets

(56) References Cited

U.S. PATENT DOCUMENTS

| | | | | |
|---|---|---|---|---|
| 2003/0120370 A1* | 6/2003 | Kitayama | ............... | H02J 3/008 700/100 |
| 2004/0220702 A1* | 11/2004 | Matsubara | ................ | H02J 3/14 700/291 |
| 2010/0076825 A1* | 3/2010 | Sato | ......................... | B60L 55/00 705/14.1 |
| 2014/0351008 A1 | 11/2014 | Oyamatsu et al. | | |
| 2014/0371933 A1* | 12/2014 | Iwamura | ............... | G06F 1/3209 700/291 |
| 2016/0004297 A1* | 1/2016 | Kazuno | ............... | H02J 13/0079 713/320 |
| 2016/0275222 A1* | 9/2016 | Otsuki | .................... | G06F 30/20 |
| 2017/0133866 A1* | 5/2017 | Itoh | ................... | H02J 13/00004 |
| 2017/0256952 A1* | 9/2017 | Sugahara | .............. | H02J 7/0013 |
| 2019/0324070 A1* | 10/2019 | Saneyoshi | ................. | H02J 3/28 |

FOREIGN PATENT DOCUMENTS

| | | |
|---|---|---|
| JP | 2004-138265 A | 5/2004 |
| JP | 2004-257897 A | 9/2004 |
| JP | 2007-14179 A | 1/2007 |
| JP | 2012-17930 A | 1/2012 |
| JP | 2013-101057 A | 5/2013 |
| JP | 2014-9895 A | 1/2014 |
| JP | 2014-143819 A | 8/2014 |
| JP | 2014-229252 A | 12/2014 |
| JP | 2015-6105 A | 1/2015 |
| JP | 2015-132872 A | 7/2015 |
| JP | 2017-50971 A | 3/2017 |

OTHER PUBLICATIONS

Singapore Written Opinion for Singapore Application No. 11202012877T, dated May 24, 2021.

\* cited by examiner

Fig. 5

$$\begin{bmatrix} y_1 \\ y_2 \\ \vdots \\ y_N \end{bmatrix} = \begin{bmatrix} x1_1 & x2_1 & \cdots & xM_1 & r1_1 & r2_1 & \cdots & rI_1 & 1 \\ x1_2 & x2_2 & \cdots & xM_2 & r1_2 & r2_2 & \cdots & rI_2 & 1 \\ \vdots & \vdots & \cdots & \vdots & \vdots & \vdots & \cdots & \vdots & \vdots \\ x1_N & x2_N & \cdots & xM_N & r1_N & r2_N & \cdots & rI_N & 1 \end{bmatrix} \begin{bmatrix} a1 \\ a2 \\ \vdots \\ aM \\ b1 \\ b2 \\ \vdots \\ bI \\ c \end{bmatrix}$$

- DIRECTION OF TIME POINT (1~N)
- STATUS MATRIX
- OPERATION STATUSES OF FIRST TO MTH OBJECT FACILITIES
- COMPONENTS OF FIRST TO ITH REFERENCE SIGNALS
- CONTRIBUTION DEGREE OF OBJECT FACILITY: $a1, a2, \ldots, aM$
- CONTRIBUTION DEGREE OF REFERENCE SIGNAL: $b1, b2, \ldots, bI$
- CONSTANT TERM: $c$

POWER CONSUMPTION ESTIMATION DEVICE

CROSS REFERENCE TO RELATED APPLICATIONS

This application is a Continuation of PCT International Application No. PCT/JP2019/009600, filed on Mar. 11, 2019, which claims priority under 35 U.S.C. 119(a) to Patent Application No. 2018-122208, filed in Japan on Jun. 27, 2018, all of which are hereby expressly incorporated by reference into the present application.

TECHNICAL FIELD

The present specification discloses a power consumption estimation device which estimates power consumption of each of one object facility or more which are installed in a predetermined area and whose operation statuses can be monitored.

BACKGROUND ART

In an architectural structure such as a building and a factory, when performing power management for the purpose of energy saving, it is necessary to figure out power consumption of each of a plurality of electric facilities installed in the architectural structure. However, in order to measure such power consumption, each electric facility must be provided with an electric power meter, which is costly.

Therefore, in some cases, techniques have been proposed which estimate power consumption of each facility by performing a regression analysis based on time-series data of total power consumption of a predetermined area and time-series data indicating a driving status of the facility installed in the predetermined area.

For example, Patent Literature 1 discloses a device that calculates power consumption of each of a plurality of air conditioners installed in a predetermined area. In this Patent Literature 1, full air-conditioner power consumption of the plurality of air conditioners is found from total power consumption of the predetermined area and from base power which is power consumed by other than the air conditioners. Power consumption of each air conditioner is found based on time-series data of the full air-conditioner power consumption and time series-data indicating a driving status of each of the plurality of air conditioners. According to this technique, it is not necessary to provide a power measuring device per facility, so that power consumption of each of the plurality of facilities can be acquired at a low cost.

CITATION LIST

Patent Literature

Patent Literature 1: JP 2004-138265 A
Patent Literature 2: JP 2017-050971 A

SUMMARY OF INVENTION

Technical Problem

However, the technique of Patent Literature 1 has a problem that the estimation accuracy of the base power, which is power consumed by other than the air conditioners, is low, and as a result, the estimation accuracy of the power consumption per facility is also low. That is, in Patent Literature 1, total power consumption of a specific date and time (for example, total power consumption of a time frame where the air conditioners are not operating, of a certain day satisfying a specific condition) is estimated as power consumed by other than the air conditioners, that is, estimated as base power, and a value of this base power is considered to be constant even on a different day and month.

However, power consumed by other than the air conditioners varies such as power consumed by lighting, personal computers, office equipment, and cooking equipment. Usually, these power usage amounts (power consumption) are changing moment by moment. Therefore, when the base power is considered to be constant as in Patent Literature 1, a deviation from the actual power becomes large, and the estimation accuracy of the power consumption of each air conditioner deteriorates.

Therefore, in some cases, it has been proposed to estimate an amount of power consumed by a facility such as an office facility whose driving status cannot be monitored by a power consumption estimation device from a number of people existing in a predetermined area (for example, Patent Literature 2). However, in this case, a system for managing the number of people is required separately, leading to an increase in cost.

Therefore, the present specification discloses a power consumption estimation device that can estimate power consumption of each object facility installed in a predetermined area, with a simpler configuration and with higher accuracy.

Solution to Problem

A power consumption estimation device to be disclosed in the present specification is a power consumption estimation device which estimates power consumption of each of one object facility or more which are installed in a predetermined area and whose operation statuses can be monitored, the power consumption estimation device including:

a total power consumption acquisition unit to acquire time-series data of total power consumption which is power consumption of the predetermined area as a whole;

an operation status acquisition unit to acquire time-series data of an operation parameter numeralized from the operation statuses of the one object facility or more;

a reference signal generation unit to generate one reference signal or more each expressed by a predetermined basis function;

a contribution degree estimation unit to perform multiple regression analysis by taking the acquired total power consumption as an objective variable, and the acquired operation parameter of the one object facility or more and a component value of the generated one reference signal or more, as explanatory variables, to thereby calculate a contribution degree of each of the one object facility or more to the total power consumption; and a power consumption calculation unit to multiply the contribution degree of the object facility and the operation parameter of the object facility, to thereby calculate power consumption of the object facility.

In this case, the power consumption calculation unit may calculate power consumption of each of the one target facility or more of each time period, to thereby generate a breakdown of the total power consumption of each time period.

Also, the basis function may be a function in which a leading edge of a substantial inverted V shape or of a substantial rectangle rises only once. In this case, each reference signal may be a signal in which a signal expressed by the basis function is repeated every unit time. Furthermore, the one reference signal or more may be classified into one signal group or more, and each signal group may include a plurality of reference signals whose shapes are the same and whose phases are different from each other. In this case, the plurality of reference signals belonging to the same signal group may be each expressed by a substantial inverted V-shaped function having an inverted V shape with a width W, and may have phases being shifted from each other by W/2. Furthermore, the one reference signal or more may be classified into two signal groups or more, and a width of an inverted V shape of a reference signal belonging to one signal group may be different from a width of an inverted V shape of a reference signal belonging to another signal group.

Advantageous Effects of Invention

According to a power consumption estimation device disclosed in the present specification, power consumed by other than an object facility is simulated by a plurality of reference signals. Therefore, power consumption of each object facility installed in a predetermined area can be estimated with a simpler configuration and with higher accuracy.

BRIEF DESCRIPTION OF DRAWINGS

FIG. 5 is a diagram that explains a regression model.

DESCRIPTION OF EMBODIMENTS

Figure 1:
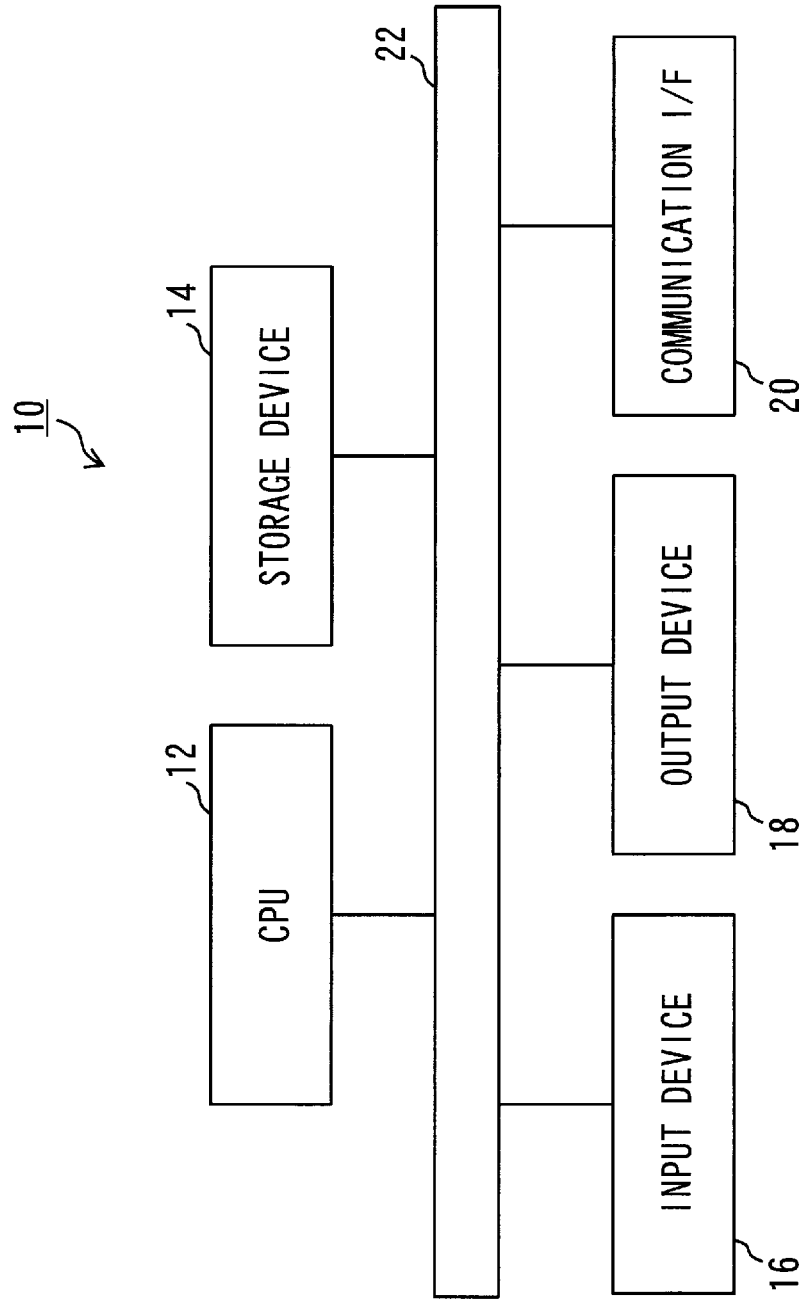
FIG. 1 is a block diagram illustrating a physical configuration of a power consumption estimation device.
Figure 2:
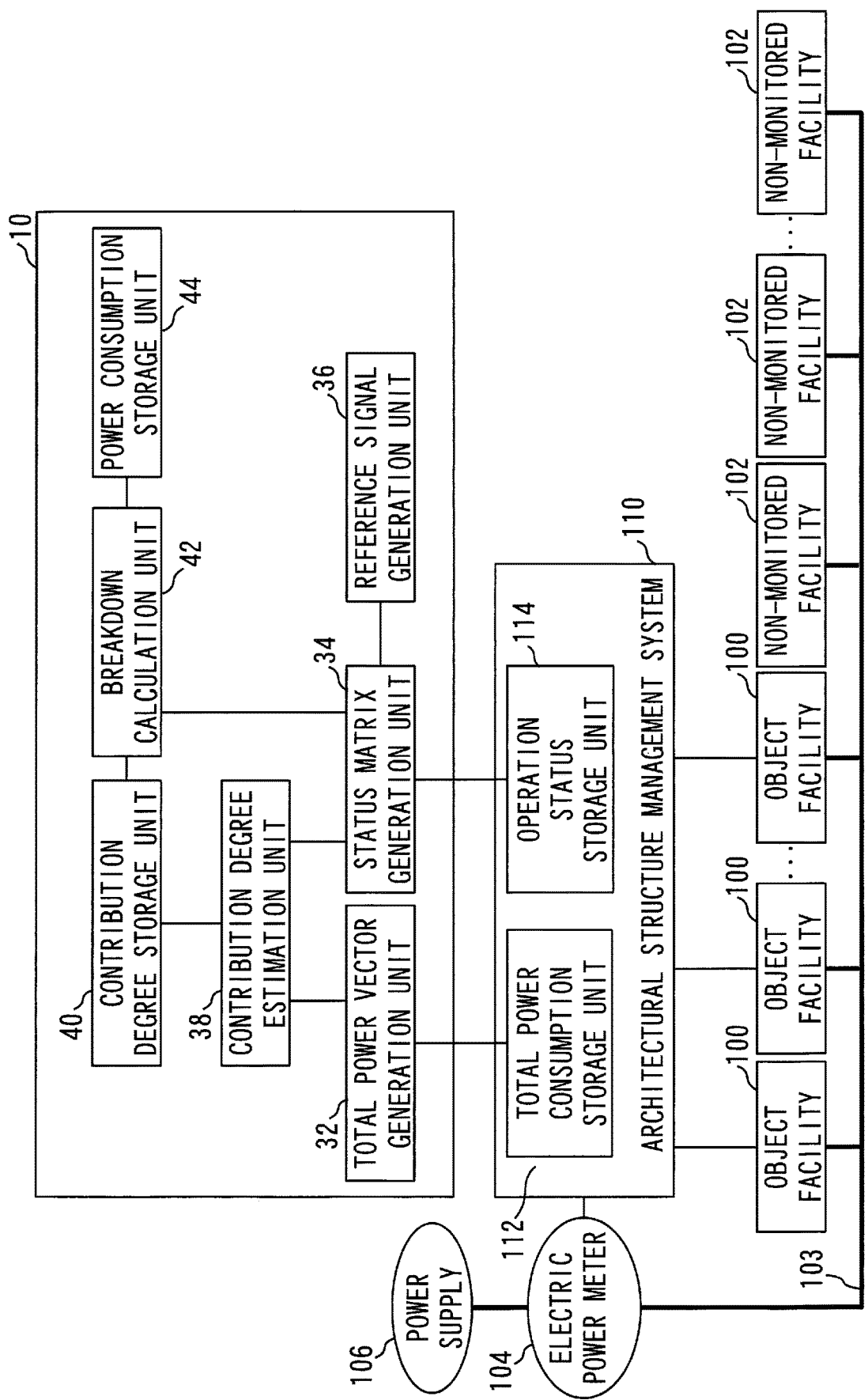
FIG. 2 is a block diagram illustrating a functional configuration of the power consumption estimation device.

A configuration of a power consumption estimation device 10 will be described with referring to drawings. FIG. 1 is a block diagram illustrating a physical configuration of the power consumption estimation device 10. FIG. 2 is a block diagram illustrating a functional configuration of the power consumption estimation device 10. This power consumption estimation device 10 is a device that estimates power consumption of each of one object facility or more installed in a predetermined area by regression analysis. That is, in general, an architectural structure such as a building and a factory is provided with an electric power meter that measures power consumption of the entire architectural structure or of an entire floor. Using this electric power meter, total power consumption of the predetermined area (for example, the entire architectural structure or entire floor) can be figured out.

However, when managing power for the purpose of energy saving, it is desired to figure out not only the total power consumption but also power consumption of each of one object facility or more (to be referred to as "individual power consumption" hereinafter) installed in a predetermined area. The object facility is a facility whose operation is managed by an architectural structure management system and is, for example, an air-conditioning facility. To figure out individual power consumption of such an object facility accurately, it is necessary to provide an electric power meter per object facility. However, to provide an electric power meter per object facility leads to an increase in cost. In view of this, the power consumption estimation device 10 estimates individual power consumption of such an object facility based on total power consumption and based on an operation status of the object facility. In the following, description will be made on, as an example, a power consumption estimation device 10 in which one entire building will be defined as "predetermined area", and a plurality of air-conditioning facilities installed in the entire building are the "object facility".

As illustrated in FIG. 1, the power consumption estimation device 10 is constructed from one computer or more which are driven according to a particular program. That is, the power consumption estimation device 10 is provided with a CPU 12, a storage device 14, an input device 16, an output device 18, and a communication interface (to be referred to as "communication I/F" hereinafter) 20, which are connected to each other via a bus 22, as illustrated in FIG. 1.

The CPU 12 performs various types of computations. Specifically, the CPU 12 reads as necessary a power consumption estimation program stored in the storage device 14, and performs various types of computations required for estimating power consumption. A specific content of a process by the CPU 12 will be described later.

The storage device 14 stores various types of data (including the program) and is configured by a combination of one or more of, for example, a semiconductor memory such as a RAM and a ROM, a hard disk drive, and a solid-state drive. The power consumption estimation program for estimating the power consumption (to be described later) is stored in the storage device 14.

The input device 16 accepts an operation instruction and data input which are given by an operator, and is configured by a combination of one or more of, for example, a keyboard, a mouse, a touch panel, and a microphone. The output device 18 outputs various types of information to the operator, and is configured by a combination of one or more of, for example, a display and a speaker.

The communication I/F 20 exchanges data with another electronic apparatus and an information terminal. For example, total power consumption detected by an architectural structure management system and an operation status of the object facility (air-conditioning facility) are inputted to the power consumption estimation device 10 via the communication I/F 20. A diagnosis result by the power consumption estimation device 10 may be sent to another information terminal via the communication I/F 20. FIG. 1 illustrates the power consumption estimation device 10 as one computer. However, the power consumption estimation device 10 may be configured of a plurality of computers that can communicate with each other. The power consumption estimation device 10 may be part of the architectural structure management system.

The functional configuration of the power consumption estimation device 10 will now be described with referring to FIG. 2. A plurality of object facilities 100 and a plurality of non-monitored facilities 102 are installed in the building. The object facilities 100 are the facilities whose individual power consumption is to be estimated and whose operation is managed by an architectural structure management system 110. In the present example, air-conditioning facilities such as an air-conditioning indoor unit and an air-conditioning outdoor unit installed in the building are the object facilities 100.

Among the facilities that consume power, the non-monitored facilities 102 are those facilities not managed by the architectural structure management system 110. Accordingly, the non-monitored facilities 102 include, for example, lighting and an electric outlet. The object facilities 100 and the non-monitored facilities 102 are both connected to a power supply 106 via a power supply line 103, and receive power from the power supply 106. A total value of power supplied to the object facilities 100 and power supplied to the non-monitored facilities 102, that is, total power consumption, is measured by an electric power meter 104.

The architectural structure management system 110 manages operation of the object facility 100 according to a preset management program. A configuration of the architectural structure management system 110 may be changed as necessary. The architectural structure management system 110 has at least an operation status storage unit 114 and a total power consumption storage unit 112.

The operation status storage unit 114 stores time-series data of the operation status of each of the plurality of object facilities 100. More specifically, the architectural structure management system 110 acquires the operation status of each object facility 100 periodically, and stores the operation status in the operation status storage unit 114 as being associated with date and time. Here, the architectural structure management system 110 expresses the operation status by a numerical value. For example, "operating" is expressed by a numerical value "1", and "operation stopped" by "0". In the following, a numerical value expressing an operation status will be called operation parameter. The value of the operation parameter may be a binary value that expresses "operating" by "1" and "operation stopped" by "0", as mentioned above. In another mode, the value of the operation parameter may be multilevel according to operation types, and may express "heating" by "1", "cooling" by "0.8", "ventilating" by "0.3", and "operation stopped" by "0". In still another mode, the value of the operation parameter may be set in accordance with a difference value between an air-conditioning target temperature and a present room temperature, a rotation speed of a compressor, or the like. In any case, time-series data of numerical values (operation parameter values) expressing the operation statuses of the plurality of object facilities 100 is stored in the operation status storage unit 114.

The total power consumption storage unit 112 stores time-series data of the total value of the power consumption of the entire building (total power consumption). Specifically, the architectural structure management system 110 periodically acquires the total power consumption per unit time measured by the electric power meter 104, and stores the acquired total power consumption in the total power consumption storage unit 112 as being associated with date and time. A sampling timing of the total power consumption and a sampling timing of the operation status of the object facility 100 are desirably matched with each other. A sampling period is not particularly limited, but is desirably set to a value falling within a range of 30 seconds to 1 hour, and is more desirably set to a value falling within a range of 1 minute to 10 minutes.

In the present example, the time-series data of the operation parameter value and the time-series data of the total power consumption are stored in the architectural structure management system 110. Alternatively, these pieces of data may be stored in the storage device 14 provided to the power consumption estimation device 10.

The power consumption estimation device 10 performs multiple regression analysis by taking the total power consumption as an objective variable, and the operation parameter value and a component of the reference signal (to be described later), as explanatory variables, to thereby estimate individual power consumption of each of the plurality of object facilities 100. Prior to describing the functional configuration of the power consumption estimation device 10, a principle of estimating the individual power consumption will be described.

A total power consumption $y_n$ at a certain sampling timing n is a sum of a total value $X_n$ of the individual power consumption of the plurality of object facilities 100 and a total value $R_n$ of the individual power consumption of the plurality of non-monitored facilities 102. Namely, $y_n = X_n + R_n$. In the following, $X_n$ will be called "object power consumption", and $R_n$ will be called "non-monitored power consumption".

Assuming that the individual power consumption of an mth object facility 100 depends on an operation status (operation parameter $xm_n$) of the mth object facility 100, the individual power consumption of the mth object facility 100 can be expressed as ($xm_n \cdot am$) where am is a contribution degree being set in each object facility 100. The object power consumption $X_n$ which is a total value of the individual power consumption of the first to Mth object facilities 100 can be expressed by Expression 1.

[Formula 1]

$$X_n = \Sigma_{m=1}^{M}(xm_n \cdot am) \qquad \text{Expression 1}$$

Figure 3:
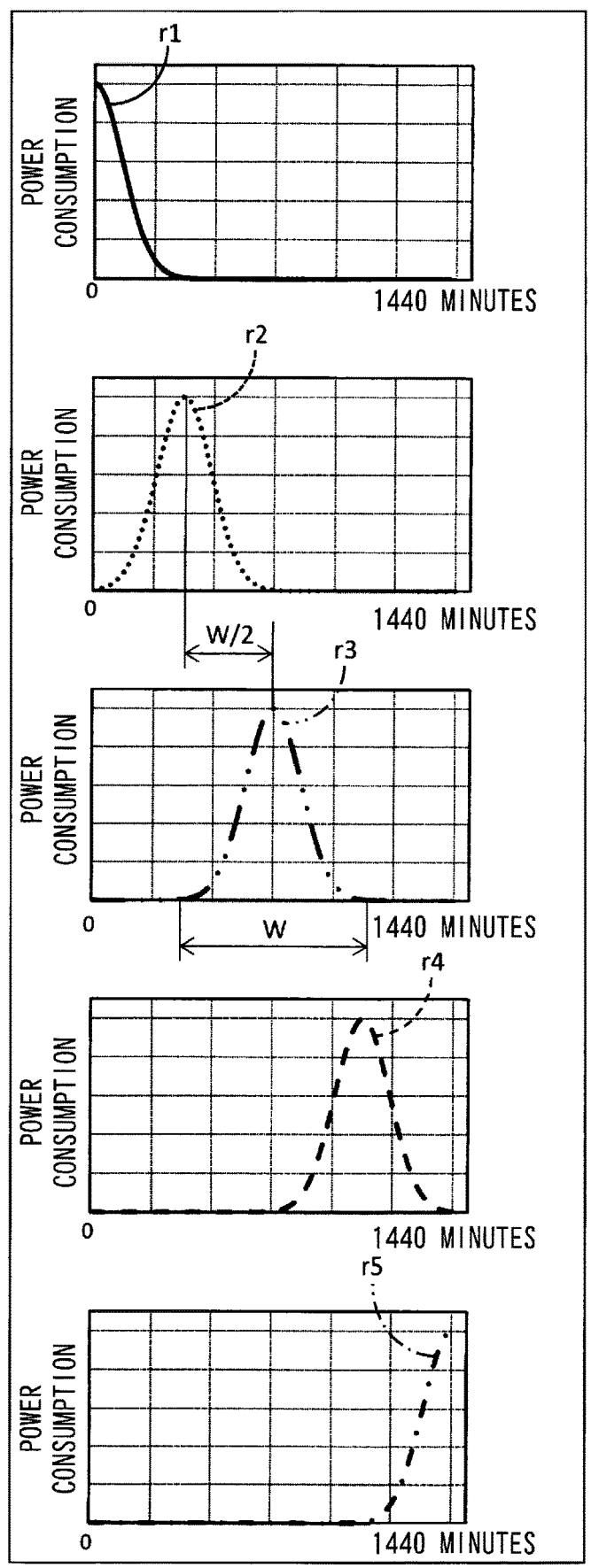
FIG. 3 is a diagram illustrating examples of a reference signal.
Figure 4:
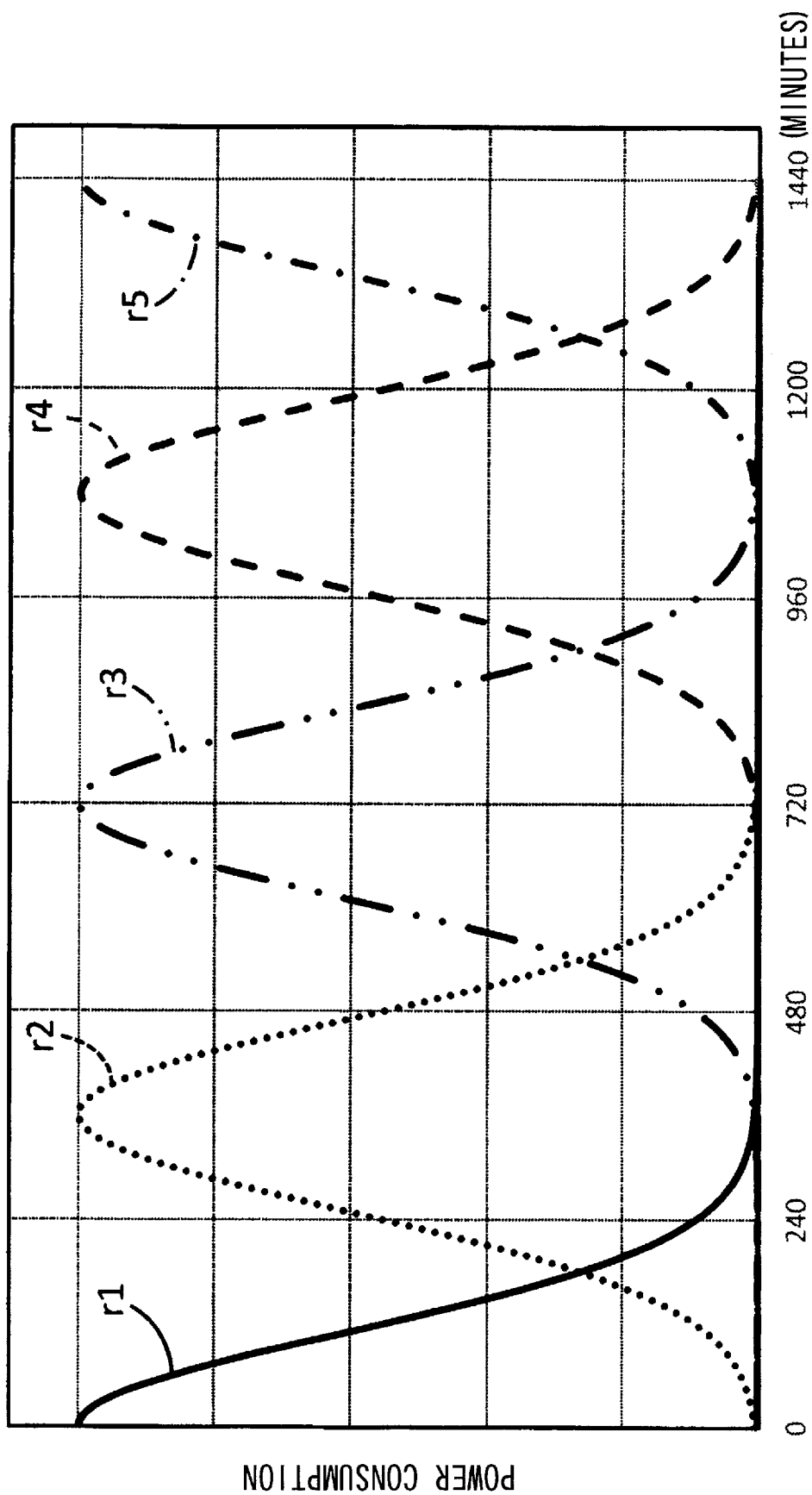
FIG. 4 is a diagram in which a plurality of reference signals are superposed.

Meanwhile, as the operation status of the non-monitored facility 102 cannot be figured out, a model like the object facility 100 cannot be constructed. In view of this, in the present example, non-monitored power consumption $R_n$ which is a total of the individual power consumption of the non-monitored facilities 102 is simulated with using a plurality of reference signals ri (i=1, 2, . . . , 1). FIGS. 3 and 4 are diagrams illustrating examples of the reference signal. FIG. 3 is a diagram illustrating first to fifth reference signals r1 to r5, and FIG. 4 is a diagram in which the first to fifth reference signals r1 to r5 are superposed.

The reference signal is a signal in which a signal expressed by a predetermined basis function is repeated every unit time (for example, every 24 hours). The type of the basis function is not particularly limited, but the basis function is desirably a function in which a leading edge of a substantial inverted V shape or of a substantial rectangle rises only once. In the present example, a Gaussian function indicated by Expression 2 is used as the basis function.

[Formula 2]

$$f(t) = \exp\left\{-\frac{(t-\mu)^2}{2 \cdot \sigma^2}\right\}$$  Expression 2

The Gaussian function is an inverted V-shaped (more precisely, bell-shaped) function in which a width W of an inverted V shape depends on a and a center of the inverted V shape depends on μ. The ith reference signal ri is a signal in which a signal expressed by Expression 2 is repeated every 24 hours. In the example of FIGS. 3 and 4, a width W of the inverted V shape of each of the reference signals r1 to r5 corresponds to approximately 12 hours=720 minutes. The phases of the plurality of reference signals are shifted by 6 hours=360 minutes, which is approximately ½ the width W of the inverted V shape. Note that the width W of the inverted V shape represents a period taken since a value of ri exceeds 1% of the peak value until reaching less than 1%.

In the present example, the non-monitored power consumption $R_n$ is expressed as Expression 3 with using the first to Ith reference signals r1 to rI. Note that bi is a contribution degree being set in each reference signal ri, and that c signifies power consumption which is a constant term and which occurs constantly without depending on time.

[Formula 3]

$$R_n = c + \sum_{i=1}^{I}(ri_n \cdot bi)$$  Expression 3

In the above description, the operation parameter $xm_n$ of the object facility 100, the reference signal $ri_n$, and the total power consumption $y_n$ are known, while the contribution degrees am and bi and the constant term c are unknown. If the contribution degrees am and bi and the constant term c can be solved, the individual power consumption $xm_n \cdot am$ of the object facility 100 can be found. Hence, in the present example, the power consumption is modeled by Expression 4, and the contribution degrees am and bi and the constant term c are found by multiple regression analysis. FIG. 5 illustrates an explanation of individual terms of Expression 4.

[Formula 4]

$$\begin{bmatrix} y_1 \\ y_2 \\ \vdots \\ \vdots \\ y_N \end{bmatrix} = \begin{bmatrix} x1_1 & x2_1 & \ldots & xM_1 & r1_1 & r2_1 & \ldots & rI_1 & 1 \\ x1_2 & x2_2 & \ldots & xM_2 & r1_2 & r2_2 & \ldots & rI_2 & 1 \\ \vdots & \vdots & & \vdots & \vdots & \vdots & & \vdots & \vdots \\ \vdots & \vdots & & \vdots & \vdots & \vdots & & \vdots & \vdots \\ x1_N & x2_N & \ldots & xM_N & r1_N & r2_N & \ldots & rI_N & 1 \end{bmatrix} \begin{bmatrix} a1 \\ a2 \\ \vdots \\ aM \\ b1 \\ b2 \\ \vdots \\ bI \\ c \end{bmatrix}$$  Expression 4

If N>(M+I+1), Expression 4 can be solved. Hence, if the total power consumption $y_n$ and the operation parameter $xm_n$ can be collected (M+I+1) times or more, the contribution degrees am and bi and the constant term c can be calculated. By multiplying the operation parameter $xm_n$ of each object facility 100 by the calculated contribution degree am, power consumption of the mth object facility 100 at a sample timing n can be calculated. In the following, the left-hand side of Expression 4 is called "total power vector". The first matrix on the right-hand side of Expression 4 is called "status matrix".

The power consumption estimation device 10 has a functional configuration that can perform the above computation. Now, the functional configuration of the power consumption estimation device 10 will be described with referring to FIG. 2 again. A total power vector generation unit 32 generates the total power vector, that is, the vector on the left-hand side of Expression 4, from the time-series data of the total power consumption $y_n$ stored in the total power consumption storage unit 112. Hence, the total power vector generation unit 32 functions as a total power consumption acquisition unit to acquire the time-series data of the total power consumption $y_n$. At this time, a number N of samples constituting the total power vector is not particularly limited as far as it is equal to or more than a value (M+I+1) which is a sum of a number M of object facilities 100, a number I of reference signals, and 1. Note that the number N of samples is desirably equal to a number corresponding to 24 hours or more.

A status matrix generation unit 34 generates the status matrix based on the time-series data of the operation parameter value $xm_n$ stored in the operation status storage unit 114 and based on the reference signal $ri_n$ generated by a reference signal generation unit 36. The status matrix generation unit 34 functions as an operation status acquisition unit to acquire the time-series data of the operation parameter value $xm_n$. The reference signal generation unit 36 generates the reference signal $ri_n$ in response to a request from the status matrix generation unit 34.

The generated total power vector and the generated status matrix are inputted to a contribution degree estimation unit 38. The contribution degree estimation unit 38 assigns the total power vector and the status matrix to Expression 4, and solves the contribution degrees am and bi and the constant term c. This calculation can use a known multiple regression analysis technique, and accordingly its detailed description will be omitted.

The contribution degrees am and bi and the constant term c which are calculated by the contribution degree estimation unit 38 are stored in a contribution degree storage unit 40. A breakdown calculation unit 42 multiplies the operation parameter $xm_n$ of the object facility 100 by am stored in the contribution degree storage unit 40, to calculate the individual power consumption of the object facility 100. The breakdown calculation unit 42 functions as a power consumption estimation unit. The breakdown calculation unit 42 also assigns the reference signal $ri_n$, and bi and c stored in the contribution degree storage unit 40, to Expression 3, to calculate entire power consumption of the plurality of non-monitored facilities 102, that is, the non-monitored power consumption $R_n$. By doing this, the breakdown of the power consumption of each time period is calculated. The calculated breakdown (the individual power consumption of each object facility 100 and the non-monitored power consumption $R_n$) is stored in a power consumption storage unit 44 as being associated with a time point.

Figure 6:
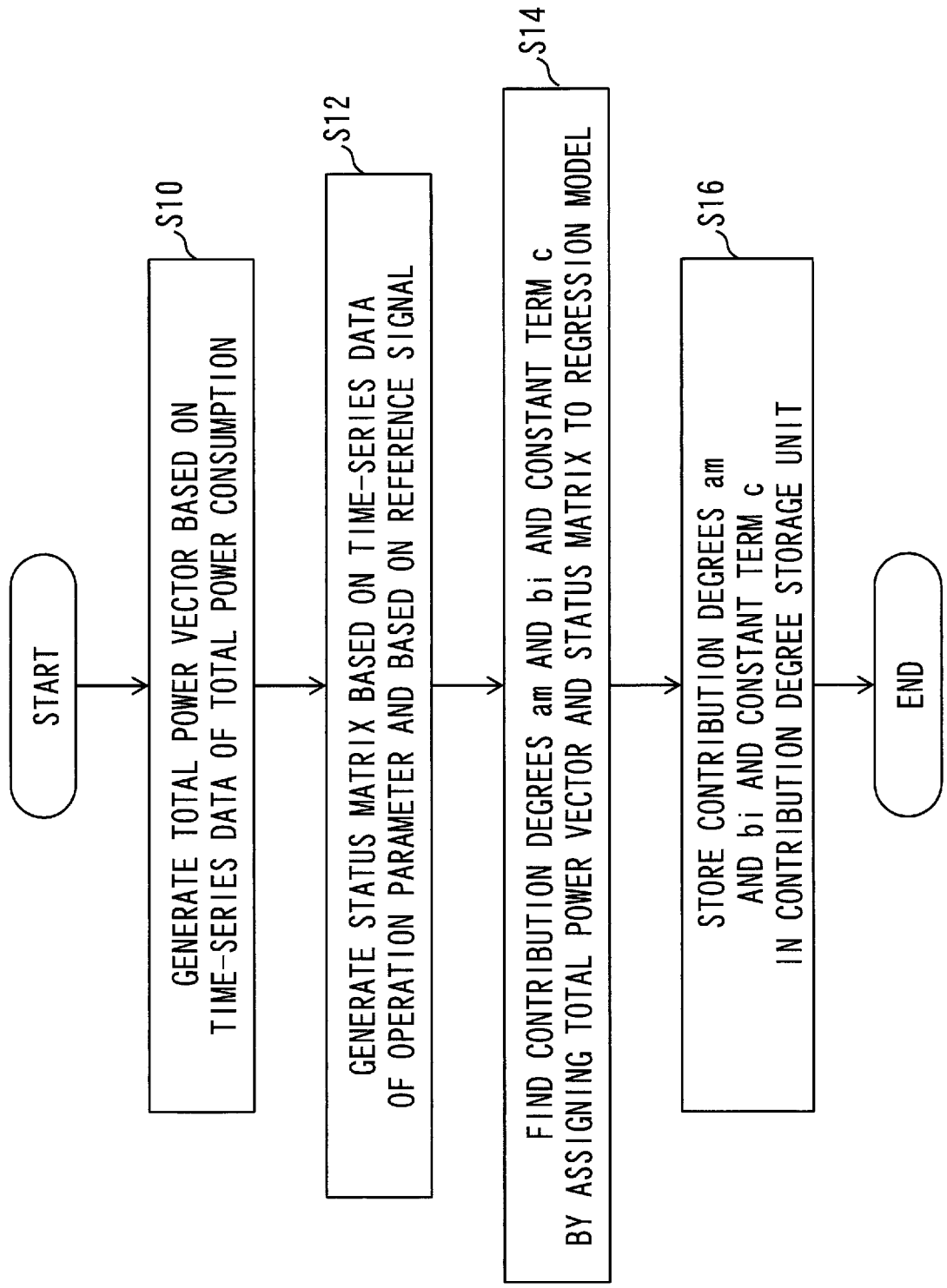
FIG. 6 is a flowchart illustrating a contribution degree estimation process.

A flow of a power consumption estimation process by the power consumption estimation device 10 will be described with referring to FIGS. 6 and 7. The power consumption estimation process is roughly divided into a contribution degree estimation process and a power consumption breakdown estimation process. FIG. 6 illustrates a flow of the contribution degree estimation process. It suffices if this contribution degree estimation process is executed at least once. To improve the estimation accuracy, it is desired to execute the contribution degree estimation process repeatedly at certain intervals and to update the values of the contribution degrees and the value of the constant term which are stored in the contribution degree storage unit 40. That is, the contribution degree am of each of the plurality of object facilities 100 expresses individual power consumption per unit time (in the above example, sampling period). The individual power consumption per unit time changes depending on the surrounding environment, deterioration of the object facility 100, and so on. By estimating and updating the contribution degrees periodically, an estimation result in which the deterioration and so on of the object facility 100 have been considered can be obtained.

When estimating the contribution degree, first, the total power vector generation unit 32 generates the total power vector based on the time-series data of the total power consumption $y_n$ (S10). Also, the power consumption estimation device 10 generates the status matrix based on the time-series data of the operation parameter $xm_n$ and based on the reference signal $ri_n$ (S12).

When the power consumption vector and the status matrix vector are generated, the contribution degree estimation unit 38 finds the contribution degrees am and bi and the constant term c by multiple regression analysis according to the regression model of Expression 4 (S14). Then, once the calculated contribution degrees am and bi and the calculated constant term c are stored in the contribution degree storage unit 40, the contribution degree estimation process ends (S16).

Figure 7:
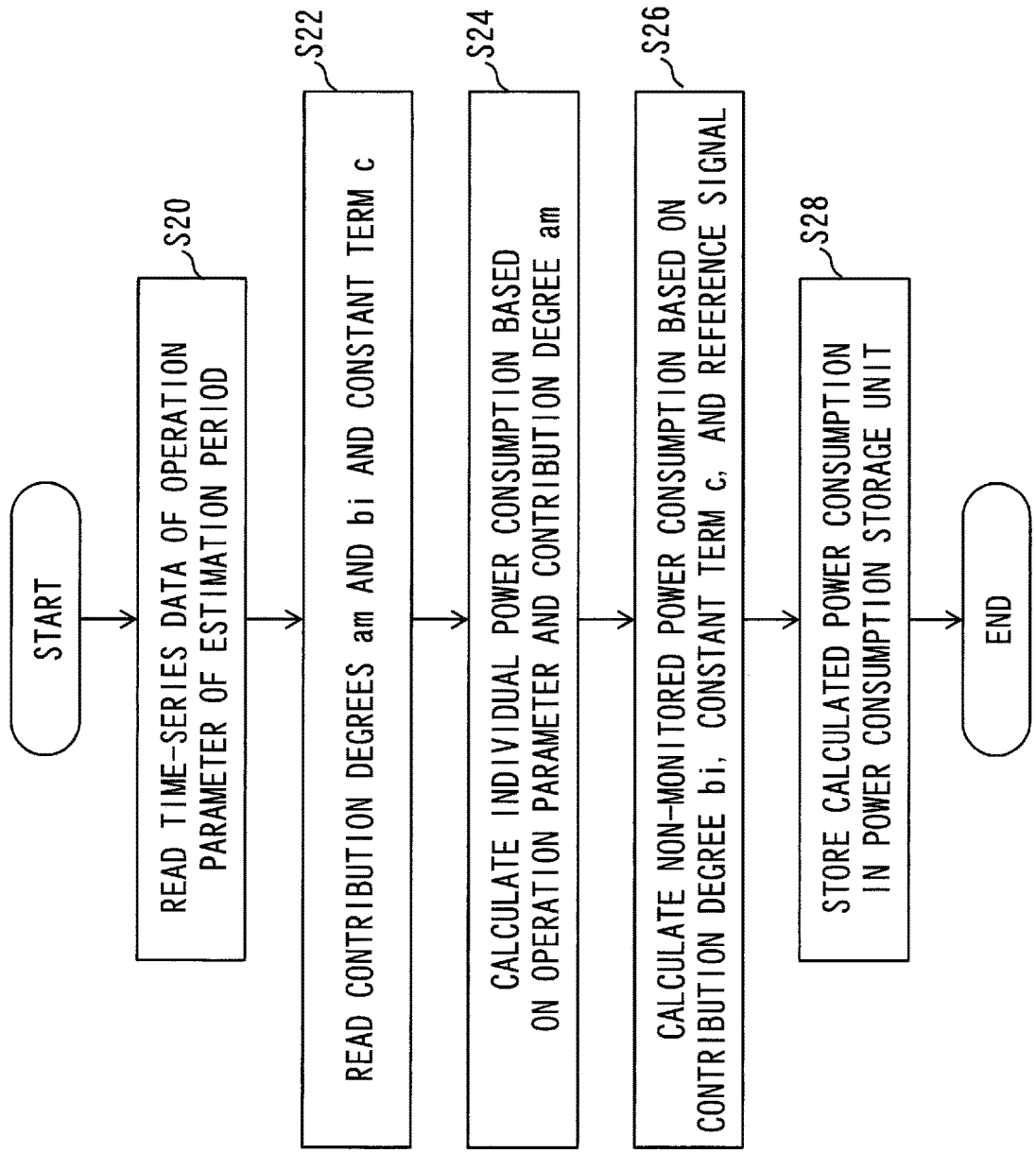
FIG. 7 is a flowchart illustrating a power consumption breakdown estimation process.

FIG. 7 is a flowchart illustrating a flow of the power consumption breakdown estimation process. This power consumption breakdown estimation process may be executed at any timing and any number of times if the contribution degrees have been calculated. Accordingly, the breakdown estimation process may be performed periodically, or at a timing instructed by the user. In any case, when estimating the breakdown, the breakdown calculation unit 42 reads the time-series data of the operation parameter $xm_n$ of each of the plurality of object facilities 100, the time-series data having been acquired during a period when the breakdown is to be estimated (S20). The breakdown calculation unit 42 also reads the plurality of contribution degrees am and bi and the constant term c, which are stored in the contribution degree storage unit 40 (S22). Subsequently, the breakdown calculation unit 42 multiplies the operation parameter $xm_n$ of the object facility 100 by the contribution degree am, to calculate the individual power consumption of the object facility 100 (S24). The breakdown calculation unit 42 also assigns the reference signal $ri_n$, and bi and c stored in the contribution degree storage unit 40, to Expression 3 (S26), to calculate the non-monitored power consumption $R_n$. Then, once the calculated power consumption is stored in the power consumption storage unit 44, the breakdown estimation process ends (S28).

As is apparent from the above description, in the present example, the non-monitored power consumption $R_n$, which is a total value of the power consumption of the non-monitored facilities 102, is simulated by the plurality of reference signals $ri_n$. Therefore, an error can be decreased more than in Patent Literature 1 where the non-monitored power consumption $R_n$ is considered to be constant. Thus, the estimation accuracy of the individual power consumption of the object facility 100 can be improved more. Also, different from Patent Literature 2 where the power consumption is simulated by a number of people, the present example does not utilize a number of people for estimating the power consumption. Therefore, a system for monitoring the number of people (for example, an admission system) becomes unnecessary, and the individual power consumption of the object facility 100 can be estimated more simply.

Figure 8:
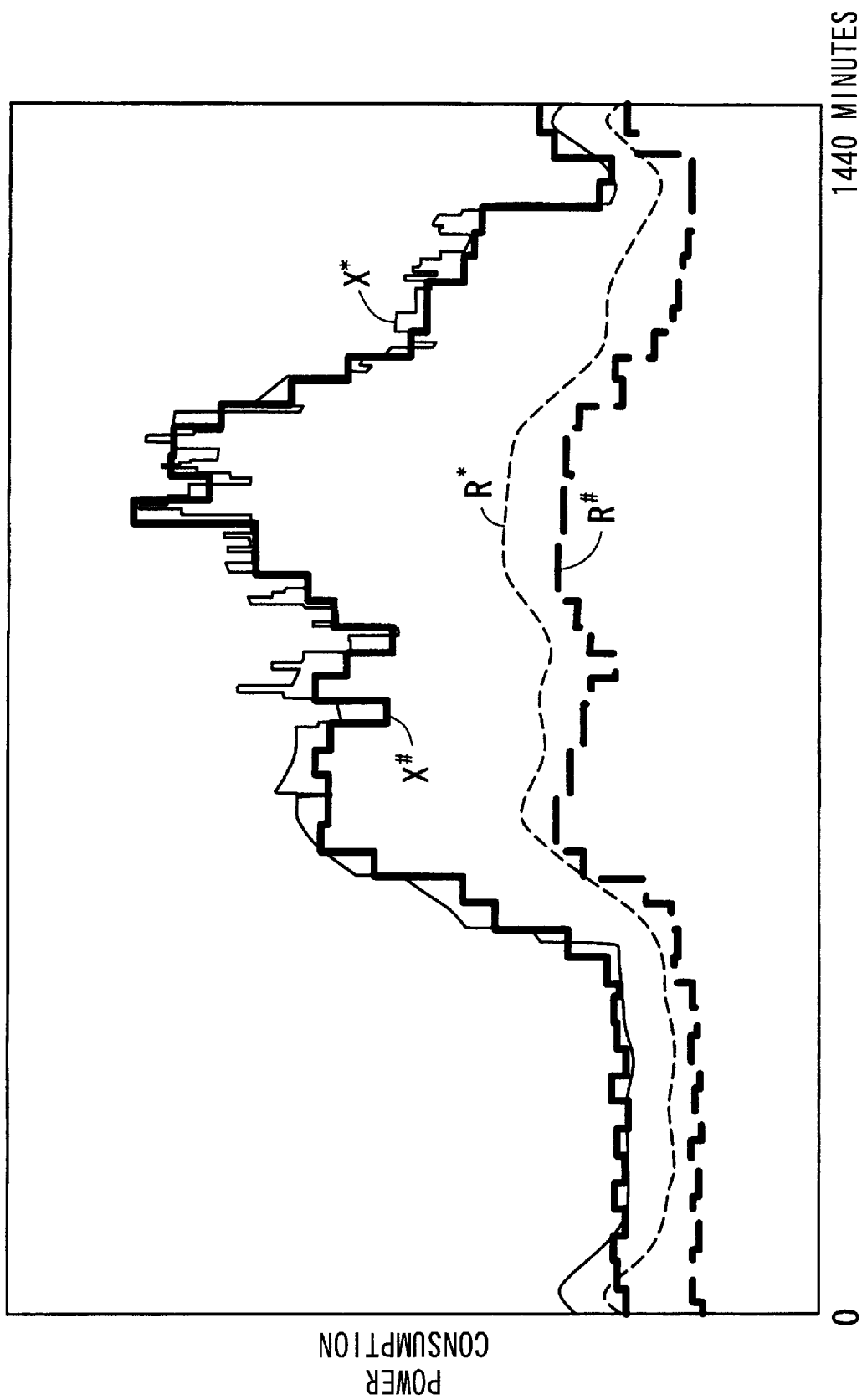
FIG. 8 is a diagram illustrating an actual measurement value and an estimation value, of power consumption according to a present example.
Figure 11:
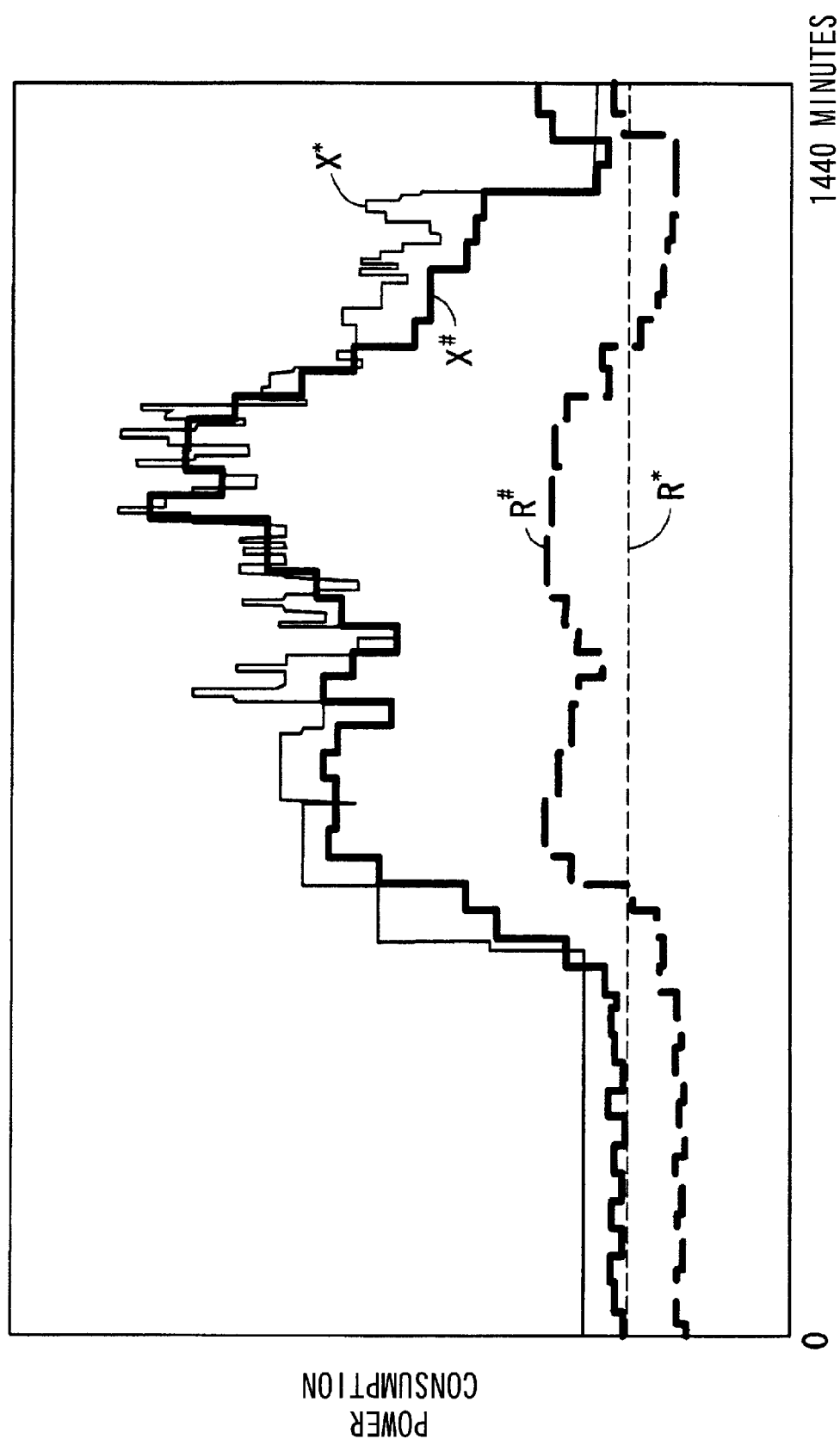
FIG. 11 is a diagram illustrating an actual measurement value and an estimation value, of power consumption according to a prior art.

In connection with this, comparison of the estimation accuracy between the present example and the prior art will now be described with referring to FIGS. 8 and 11. Each of FIGS. 8 and 11 is a graph illustrating actual measurement values $R^\#$ and $X^\#$ and estimation values $R^*$ and $X^*$ of power consumption, corresponding to 24 hours, of a certain building. A more detailed description will be made. Each of FIGS. 8 and 11 illustrates a stacked graph of the total value of the power consumption (non-monitored power consumption R) of the plurality of non-monitored facilities 102 and the total value of the individual power consumption (object power consumption X) of the plurality of object facilities 100. In FIGS. 8 and 11, a thick broken line represents the actual measurement value $R^\#$ of the non-monitored power consumption, and a thick solid line represents the actual measurement value $X^\#$, drawn to stack on the actual measurement value $R^\#$, of the object power consumption. Likewise, in FIGS. 8 and 11, a thin broken line represents the estimation value $R^*$ of the non-monitored power consumption, and a thin solid line represents the estimation value $X^*$, drawn to stack on the estimation value $R^*$, of the object power consumption.

In FIG. 11, the estimation values $R^*$ and $X^*$ are estimated based on the technique disclosed in Patent Literature 1. That is, in FIG. 11, considering that the estimation value $R^*$ is always constant, the individual power consumption of each of the plurality of object facilities 100 is found by multiple regression analysis based on the actual measurement value of the total power consumption and based on the operation statuses of the plurality of object facilities 100. Namely, in FIG. 11, each contribution degree am is found based on the regression model indicated by Expression 5. As is apparent from Expression 5, according to the prior art, in the regression model, the estimation value $R^*$ of the non-monitored power consumption is treated as a known constant term.

[Formula 5]

$$\begin{bmatrix} y_1 \\ y_2 \\ \vdots \\ \vdots \\ y_N \end{bmatrix} = \begin{bmatrix} x1_1 & x2_1 & \dots & xM_1 & 1 \\ x1_2 & x2_2 & \dots & xM_2 & 1 \\ \vdots & \vdots & & \vdots & \vdots \\ \vdots & \vdots & & \vdots & \vdots \\ x1_N & x2_N & \dots & xM_N & 1 \end{bmatrix} \begin{bmatrix} a1 \\ a2 \\ \vdots \\ aM \\ R^* \end{bmatrix} \quad \text{Expression 5}$$

As is apparent from FIG. 11, according to the prior art, the estimation value $R^*$ of the non-monitored power consumption is considered constant, so an error between the estimation value $R^*$ and actual measurement value $R^*$ of the non-monitored power consumption increases. If an error of $R^*$ being a constant term employed in the regression model is large, naturally, estimation accuracy using the regression model also deteriorates, and the estimation accuracy of the individual power consumption of the object facility 100 deteriorates. This is apparent from the fact that in FIG. 11, the error between the estimation value $X^*$ and actual measurement value $X^\#$ of the object power consumption, which is the total value of the individual power consumption of the object facility 100, is large Meanwhile, in the present example, the non-monitored power consumption is simulated with using the plurality of reference signals ri. As a result, in the present example, the error between the estimation value R* and actual measurement value $R^\#$ of the non-monitored power consumption is small, as illustrated in FIG. 8. Since the non-monitored power consumption can be estimated with high accuracy, in the present example, the estimation accuracy of the individual power consumption of the object facility 100 also improves. This is apparent also from the fact that in FIG. 8, the error between the estimation value X* and actual measurement value $X^\#$ of the object power consumption is small.

Figure 9:
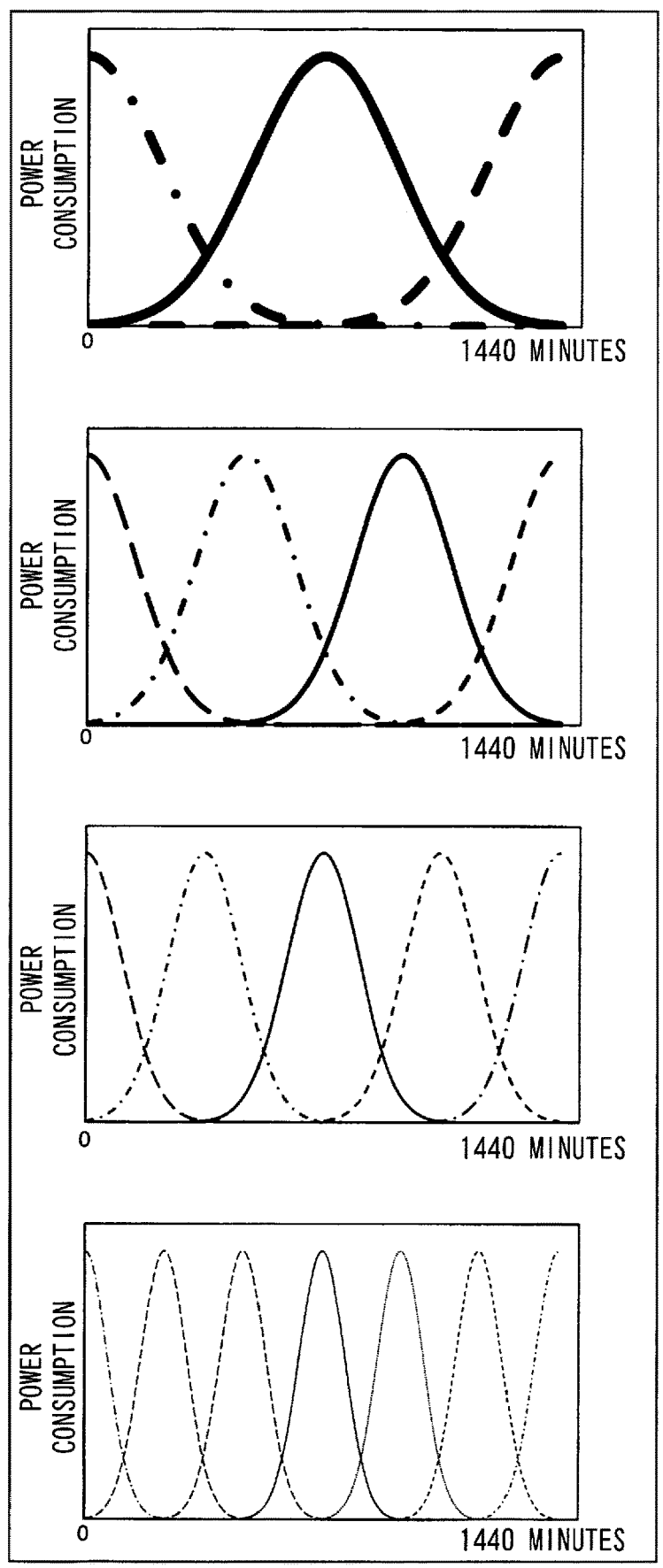
FIG. 9 is a diagram illustrating other examples of the reference signal.

The configuration described above is merely an example. As far as multiple regression analysis is performed by at least taking the time-series data of the total power consumption as an objective variable, and the time-series data of the operation parameters of the plurality of object facilities and the components of the plurality of reference signals, as explanatory variables, to find the power consumption of each of the plurality of object facilities, then, other configurations may be changed as necessary. For example, the mode of the plurality of reference signals may be changed as necessary. For example, in the above description, an inverted V-shaped signal having a width W corresponding to 12 hours is employed as the reference signal. However, the width W of the inverted V shape of the reference signal may be changed as necessary, as illustrated in FIG. 9. In FIG. 9, the width W of the reference signal Ri corresponds to 24 hours, 16 hours, 12 hours, and 8 hours from the top sequentially. Also, in any of these cases, the phases of the plurality of reference signals ri are shifted by W/2.

Figure 10:
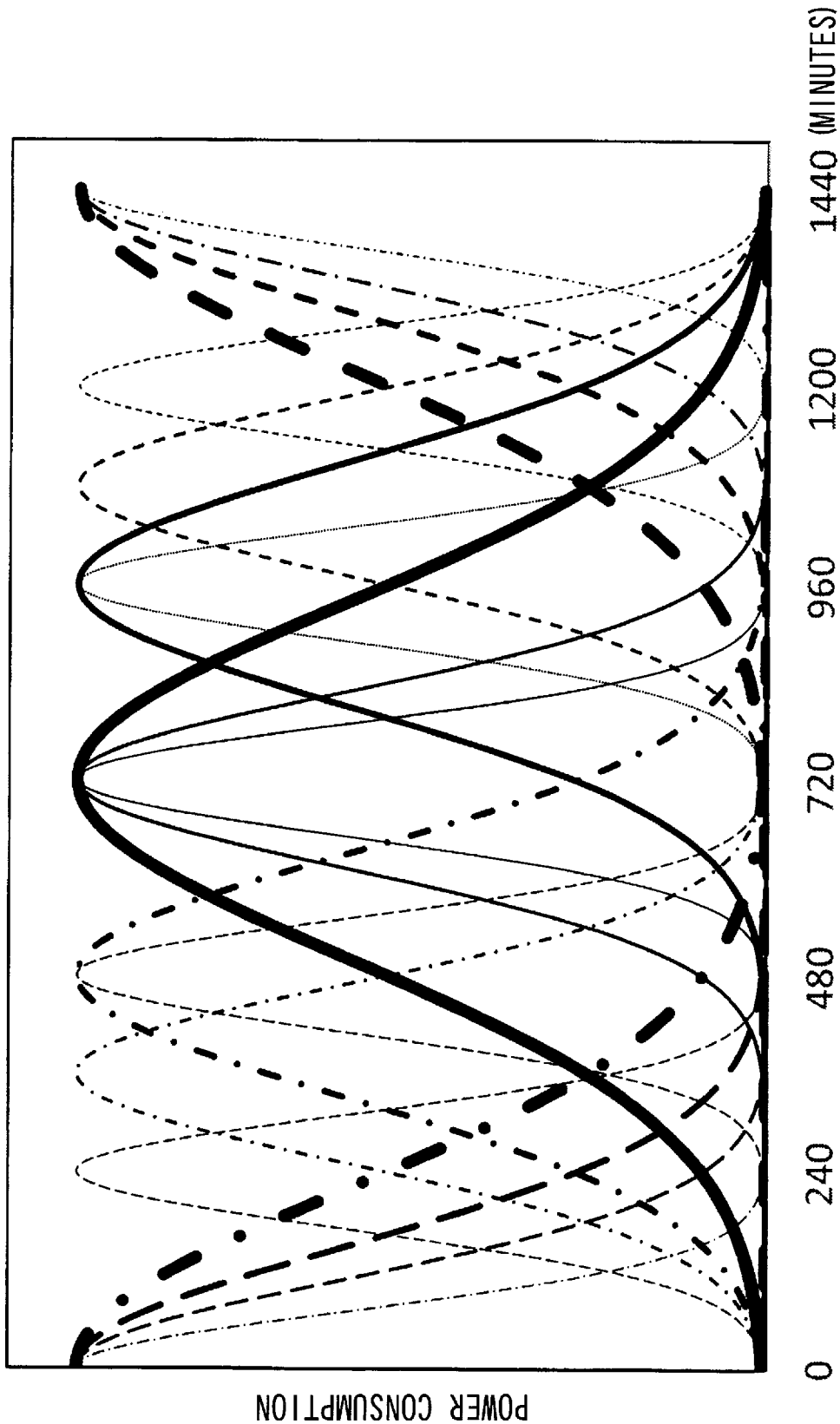
FIG. 10 is a diagram illustrating other examples of the reference signal.

The plurality of reference signals ri are classified into two signal groups or more. A width W of an inverted V shape of a reference signal ri belonging to one signal group may be different from a width W of an inverted V shape of a reference signal ri belonging to another signal group. For example, the plurality of reference signals ri may be combinations of the four types of reference signals ri illustrated in FIG. 9. The non-monitored power consumption may be simulated by the plurality of reference signals ri as illustrated in FIG. 10.

So far, a signal expressed by the Gaussian function has been used as the reference signal. However, the shape of the reference signal may be changed as necessary. Note that the basis function expressing the reference signal is desirably a function in which a leading edge of an inverted V shape or of a rectangle rises only once.

REFERENCE SIGNS LIST

10: power consumption estimation device; 12: CPU; 14: storage device; 16: input device; 18: output device; 20: communication I/F; 22: bus; 32: total power vector generation unit (total power consumption acquisition unit); 34: status matrix generation unit (operation status acquisition unit); 36: reference signal generation unit; 38: contribution degree estimation unit; 40: contribution degree storage unit; 42: breakdown calculation unit (power consumption estimation unit); 44: power consumption storage unit; 100: object facility; 102: non-monitored facility; 103: power supply line; 104: electric power meter; 106: power supply; 110: architectural structure management system; 112: total power consumption storage unit; 114: operation status storage unit.

The invention claimed is:

1. A device system which estimates power consumption of each of one object facility or more which are installed in a predetermined area and whose operation statuses can be monitored, the system comprising:
    an electric power meter that measures total power consumption which is power consumption of the predetermined area as a whole;
    a communication interface communicatively connected to an electric flow meter; and
    processing circuitry
    to acquire, through communication with the electric power meter via the communication interface, time-series data of the total power consumption which is the power consumption of the predetermined area as a whole measured by the electric power meter,
    to acquire time-series data of an operation parameter numeralized from the operation statuses of the one object facility or more,
    to generate one reference signal or more each expressed by a predetermined basis function,
    to perform multiple regression analysis by taking the acquired total power consumption as an objective variable, and the acquired operation parameter of the one object facility or more and a component value of the generated one reference signal or more, as explanatory variables, to thereby calculate a contribution degree of each of the one object facility or more to the total power consumption,
    to multiply the contribution degree of the one object facility or more and the operation parameter of the one object facility or more, to thereby calculate power consumption of the one object facility or more,
    to generate a command based on the calculated power consumption of the object facility or more, and to issue the command via the communication facility to the one object facility or more, the command being used to manage operation of the one object facility or more to reduce energy consumption.

2. The system according to claim 1,
    wherein the processing circuitry calculates power consumption of each of the one object facility or more of each time period, to thereby generate a breakdown of the total power consumption of each time period.

3. The system according to claim 1,
    wherein the basis function is a function in which a leading edge of a substantial inverted V shape or of a substantial rectangle rises only once.

4. The system according to claim 2,
    wherein the basis function is a function in which a leading edge of a substantial inverted V shape or of a substantial rectangle rises only once.

5. The system according to claim 3,
    wherein each reference signal is a signal in which a signal expressed by the basis function is repeated every unit time.

6. The system according to claim 4,
    wherein each reference signal is a signal in which a signal expressed by the basis function is repeated every unit time.

7. The system according to claim 3,
    wherein the one reference signal or more are classified into one signal group or more, and
    wherein each signal group includes a plurality of reference signals whose shapes are the same and whose phases are different from each other.

8. The system according to claim 4,
wherein the one reference signal or more are classified into one signal group or more, and
wherein each signal group includes a plurality of reference signals whose shapes are the same and whose phases are different from each other.

9. The system according to claim 5,
wherein the one reference signal or more are classified into one signal group or more, and
wherein each signal group includes a plurality of reference signals whose shapes are the same and whose phases are different from each other.

10. The system according to claim 6,
wherein the one reference signal or more are classified into one signal group or more, and
wherein each signal group includes a plurality of reference signals whose shapes are the same and whose phases are different from each other.

11. The system according to claim 5,
wherein the one reference signal or more belonging to the same signal group are each expressed by a substantial inverted V-shaped function having an inverted V shape with a width W, and have phases being shifted from each other by W/2.

12. The system according to claim 6,
wherein the one reference signal or more belonging to the same signal group are each expressed by a substantial inverted V-shaped function having an inverted V shape with a width W, and have phases being shifted from each other by W/2.

13. The system according to claim 7,
wherein the one reference signal or more are classified into two signal groups or more, and
wherein a width of an inverted V shape of a reference signal belonging to one signal group is different from a width of an inverted V shape of a reference signal belonging to another signal group.

14. The system according to claim 8,
wherein the one reference signal or more are classified into two signal groups or more, and
wherein a width of an inverted V shape of a reference signal belonging to one signal group is different from a width of an inverted V shape of a reference signal belonging to another signal group.

15. The system according to claim 9,
wherein the one reference signal or more are classified into two signal groups or more, and
wherein a width of an inverted V shape of a reference signal belonging to one signal group is different from a width of an inverted V shape of a reference signal belonging to another signal group.

16. The system according to claim 10,
wherein the one reference signal or more are classified into two signal groups or more, and
wherein a width of an inverted V shape of a reference signal belonging to one signal group is different from a width of an inverted V shape of a reference signal belonging to another signal group.

* * * * *